(12) United States Patent
Kubota et al.

(10) Patent No.: US 6,315,927 B1
(45) Date of Patent: *Nov. 13, 2001

(54) PHOTOSENSITIVE CONDUCTIVE PASTE

(75) Inventors: Masahiro Kubota, Shiga-ken; Michiaki Iha, Kusatsu; Shizuharu Watanbe, Ohmihachiman; Satoshi Miyayama; Toshikazu Oda, both of Uji, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/535,644

(22) Filed: Mar. 24, 2000

(30) Foreign Application Priority Data

Mar. 25, 1999 (JP) .................................. 11-081539
Mar. 15, 2000 (JP) .................................. 12-072757

(51) Int. Cl.⁷ ....................................... H01B 1/22
(52) U.S. Cl. .......................... 252/512; 252/513; 252/514
(58) Field of Search ................................. 252/512, 513, 252/514, 518.1

(56) References Cited

U.S. PATENT DOCUMENTS

| | | | |
|---|---|---|---|
| 5,874,197 | * | 2/1999 | Felton ................................ 430/281.1 |
| 6,075,319 | * | 6/2000 | Kanda et al. ......................... 313/584 |
| 6,159,322 | * | 12/2000 | Ogata et al. ......................... 156/230 |

FOREIGN PATENT DOCUMENTS

| | | |
|---|---|---|
| 2273101A | 6/1994 | (GB) . |
| 05-287221 | 11/1993 | (JP) . |
| 08-227153 | 9/1996 | (JP) . |
| 09-218508 | 8/1997 | (JP) . |
| 09-218509 | 8/1997 | (JP) . |
| 09-222723 | 8/1997 | (JP) . |
| 10-171107 | 6/1998 | (JP) . |

OTHER PUBLICATIONS

WPI Abstract Accession No. 1998–082693 [08] & JP 093016148 A (Tokyo Ohka), see Abstract.
WPI Abstract Accession No. 1988–351545 [25] & JP 630265238 A (Tokyo Ohka), see Abstract.
WPI Abstract Accession No. 1993–365434 [46] & JP 052071576 A (Toray), see Abstract.
WPI Abstract Accession No. 1993–291834 [37] & JP 052006600 A (Asahi), see Abstract.

* cited by examiner

*Primary Examiner*—Mark Kopec
(74) *Attorney, Agent, or Firm*—Ostrolenk, Faber, Gerb & Soffen, LLP

(57) ABSTRACT

There is disclosed a photosensitive conductive paste comprising a water- or alkali-soluble acidic-functional-group-containing organic binder, a photosensitive organic component, an organic solvent, a conductive powder such as iron or copper, and a mono-ol compound having a boiling point of about 178° C. or higher such as dipropylene glycol monoethyl ether and/or a diol compound such as pentamethylene glycol. The photosensitive conductive paste has excellent storage stability and can be developed consistently.

13 Claims, No Drawings

PHOTOSENSITIVE CONDUCTIVE PASTE

BACKGROUND OF THE INVENTION

1. Field of the Invention

The present invention relates to a photosensitive conductive paste used for forming, for example, a wiring pattern of a high-frequency electronic component.

2. Related Art

Recently, high-frequency electronic components used in mobile communication devices, satellite broadcasting receiving devices, computers and the like, have been required to have small size and high performance. Also, wiring patterns of high-frequency electronic components are required to have increased density and signal speed. In order to increase density and signal speed in the wiring pattern, the pattern must be made finer and yet form a thicker film.

Hitherto, a wiring pattern of a high-frequency electronic component has been formed as follows. Firstly, a wiring pattern is formed on an insulating substrate by use of a conductive paste comprising a conductive metallic powder of a multivalent metal such as copper and an organic vehicle containing an organic binder and an organic solvent. Subsequently, the resultant pattern is dried and fired. In this method, a wiring pattern is generally formed through screen printing, and the lower limit of the width and pitch of the thus-formed wiring pattern is approximately 50 μm.

Japanese Patent Application Laid-Open (kokai) Nos. 287221/1993 and 227153/1996 disclose a method for forming a fine thick-film wiring pattern through photolithography by use of a photosensitive conductive paste. According to the method, a photosensitive conductive paste is applied onto an insulating substrate and the paste is dried and subjected to patterning by means of photolithography, the paste containing a conductive metallic powder, an acrylic copolymer having a carboxyl group and an ethylenic unsaturated group in the side chains, a photoreactive compound, and a photopolymerization initiator.

In recent years, in consideration of environmental safety, it has been demanded that development be carried out by use of water or an aqueous alkali solution in photolithography making use of a photosensitive conductive paste. Therefore, an organic binder contains an acidic functional group such as a carboxyl group, which group has the property of releasing a proton.

However, in the case of employment of such an organic binder, ions of a multivalent metal, which ions are released into solution, may react with anions of the organic binder, which anions are formed after the protons are released, and a three-dimensional network structure may be formed by ionic cross-linking, to thereby form a gel. When a photosensitive conductive paste becomes a gel, application of the paste becomes difficult. Even if application of the paste can be carried out, development of the paste may be unstable, making employment of the paste difficult.

In order to prevent gelation of a photosensitive conductive paste, Japanese Patent Application Laid-Open (kokai) No. 218509/1997 discloses a method in which a phosphorous-containing compound such as phosphoric acid, serving as a gelation-suppressing agent, is incorporated into the paste; Japanese Patent Application Laid-Open (kokai) No. 218508/1997 discloses a method in which a compound having an azole structure such as benzotriazole, serving as a gelation-suppressing agent, is incorporated into the paste; and Japanese Patent Application Laid-Open (kokai) No. 222723/1997 discloses a method in which an organic compound having a carboxyl group such as acetic acid, serving as a gelation-suppressing agent, is incorporated in the paste. However, these methods enable only slight retardation of gelation of the paste, and even when the paste contains the gelation-suppressing agent, use of the paste is substantially difficult.

In addition, in order to prevent gelation of a photosensitive paste, Japanese Patent Application Laid-Open (kokai) No. 10171107 discloses a method in which 3-methyl-3-methoxybutanol serving as an organic solvent is incorporated into the paste. However, 3-methyl-3-methoxybutanol has a boiling point as low as 174° C., and thus, when the paste is dried after application, the organic solvent component completely vaporizes, and the effect of preventing gelation may not be exhibited. Thus, in the dried paste, a phenomenon similar to gelation may occur, i.e., a three-dimensional network structure may be formed by ionic cross-linking, and the molecular weight of the paste may become substantially high. As a result, problems may occur. For example, unexposed portions of the paste may fail to dissolve into a developer.

SUMMARY OF THE INVENTION

To overcome the above described problems, preferred embodiments of the present invention provide a photosensitive conductive paste which has excellent storage stability and which enables stable development.

The present inventors have conducted extensive studies, and have found that gelation of a photosensitive conductive paste can be effectively suppressed while the paste is in its original state before application and also while the paste is in a dried state after application, by incorporating a mono-ol compound having a boiling point of about 178° C. or higher into the paste which comprises an organic binder having an acidic functional group such as a carboxyl group and a conductive metallic powder containing a multivalent metal having two or higher valences.

One preferred embodiment of the present invention provides a photosensitive conductive paste comprising a mixture of: an organic binder having an acidic functional group; a photosensitive organic component; a conductive metallic powder containing a multivalent metal; and a mono-ol compound having a boiling point of about 178° C. or higher (hereinafter the paste may be referred to as the "first photosensitive conductive paste of the present invention").

In the first photosensitive conductive paste of the present invention, the mono-ol compound may be contained in an amount by mol of at least twice that of ions of the multivalent metal released in a solution portion of the paste.

In the first photosensitive conductive paste of the present invention, an organic solvent may be further present, and the amount of the mono-ol compound may be about 10–92 wt. % based on the total amount of the mono-ol compound and the organic solvent.

In the first photosensitive conductive paste of the present invention, the material of the conductive metallic powder containing a multivalent metal may be at least one species selected from the group consisting of copper, aluminum, palladium, nickel and iron.

In the first photosensitive conductive paste of the present invention, the organic binder having an acidic functional group may be an acrylic copolymer having a carboxylic side chain.

The first photosensitive conductive paste of the present invention contains a mono-ol compound having a boiling point of about 178° C. or higher, and therefore gelation of the paste can be sufficiently suppressed while the paste is in its original state before application and while the paste is in a dried state after application, and storage stability of the paste is enhanced. In addition, the paste can be consistently developed through photolithography.

The reasons why gelation of the paste can be suppressed are described below. A hydroxyl group in a mono-ol compound has very high ability to bind to a multivalent metallic ion, as compared with an acidic functional group of an organic binder (particularly a carboxylic group). Therefore, the reaction between the mono-ol compound and the multivalent metallic ion precedes the reaction between the organic binder and the ion, and ionic cross-linking between the organic binder and the multivalent metallic ion and formation of a three-dimensional network structure are hindered. Since the mono-ol compound has only one hydroxyl group, when the mono-ol compound bonds to the multivalent metallic ion, no three-dimensional network structure is formed by ionic cross-linking.

In addition, the mono-ol compound in the first photosensitive conductive paste of the present invention has a boiling point of about 178° C. or higher, and thus, even after the paste is applied and dried, the mono-ol compound significantly remains in a dried composition, and exhibits sufficient ability to prevent gelation. As a result, consistent development can be carried out. In connection with the first photosensitive conductive paste, the term "mono-ol compound" refers to a compound having one alcoholic hydroxyl group in the molecule.

The present inventors have found that gelation of a photosensitive conductive paste can also be effectively suppressed by incorporating a diol compound having two alcoholic hydroxy groups in the molecule into the paste which comprises a mixture of an organic binder having an acidic functional group such as a carboxyl group and a conductive metallic powder containing a multivalent metal of two or higher.

Another preferred embodiment of the present invention provides a photosensitive conductive paste characterized by comprising a mixture of: an organic binder having an acidic functional group; a photosensitive organic component; a conductive metallic powder containing a multivalent metal; and a diol compound having two alcoholic hydroxyl groups in the molecule (hereinafter the paste may be referred to as the "second photosensitive conductive paste of the present invention").

The second photosensitive conductive paste of the present invention may contain the diol compound in an amount by mol of at least that of ions of the multivalent metal released in a solution portion of the paste.

In the second photosensitive conductive paste of the present invention, an organic solvent may be contained in the paste, and the amount of the diol compound may be about 10–92 wt. % based on the total amount of the diol compound and the organic solvent.

In the second photosensitive conductive paste of the present invention, the material of the conductive metallic powder containing a multivalent metal may be at least one species selected from the group consisting of copper, aluminum, palladium, nickel and iron.

In the second photosensitive conductive paste of the present invention, the organic binder having an acidic functional group may be an acrylic copolymer having a carboxylic side chain.

The second photosensitive conductive paste of the present invention contains a diol compound, and therefore gelation of the paste can be sufficiently suppressed, and storage stability of the paste is enhanced. In addition, the paste can be consistently developed through photolithography.

The reasons why gelation of the paste can be suppressed are described below. An alcoholic hydroxyl group in a diol compound has very high ability to bind to a multivalent metallic ion, as compared with an acidic functional group of an organic binder (particularly a carboxylic group). Therefore, the reaction between the diol compound and the multivalent metallic ion precedes the reaction between the organic binder and the ion, and ionic cross-linking between the organic binder and the multivalent metallic ion and formation of a three-dimensional network structure are hindered.

Other features and advantages of the present invention will become apparent from the following description of the invention.

DESCRIPTION OF PREFERRED EMBODIMENTS

The first and second photosensitive conductive pastes of the present invention will next be described in more detail.

In the first photosensitive conductive paste of the present invention, examples of the mono-ol compounds having a boiling point of about 178° C. or higher include 1-octyl alcohol, 2-octyl alcohol, nonyl alcohol, decyl alcohol, 1-methylcyclohexanol, trimethylcyclohexanol, ethylene glycol monoacetate, diethylene glycol monobutyl ether, diethylene glycol monoethyl ether, diethylene glycol monohexyl ether, diethylene glycol monomethyl ether, diethylene glycol monomethyl ether, diethylene glycol monovinyl ether, dipropylene glycol monomethyl ether, dipropylene glycol monoethyl ether, dipropylene glycol monobutyl ether, ethylene glycol isoamyl ether, ethylene glycol phenyl ether, ethylene glycol benzyl ether, trimethylhexanol, tetrahydrofurfuryl alcohol, cresol, butyl lactate, benzyl alcohol, hydroxyethyl acrylate, phenethyl alcohol, mercaptobutanol, hydroxyethyl methacrylate, hydroxyethylpiperazine, cyclohexanone oxine, hydroxymethoxyallylbenzene, hydroxymethoxybenzaldehyde, hydroxymethylpiperazine, hydroxypropionitrile, hydroxyacetonaphthone, hydroxybenzaldehyde, hydroxyacetophenone, hydroxybenzimidazole, phenylphenol, hydroxybenzoic acid, hydroxybenzophenone, benzoin, thymol, hydroxymethoxybenzoic acid, hydroxymethylbenzoic acid, hydroxymethylpyrone, hydroxynaphthoic acid, hydroxynaphthoquinone, hydroxynorbornenedicarboxyimide, hydroxyphenylacetic acid, hydroxyphenylglycine, hydroxyphthalimide, a hydroxypivalic acid neopentyl glycol ester, hydroxypropiophenone, hydroxystearic acid, hydroxysuccinic acid imide, hydroxytoluic acid, and a mixture thereof.

In the first photosensitive conductive paste of the present invention, the mono-ol compound is preferably contained in an amount by mol of at least twice that of ions of the multivalent metal released in a solution portion of the paste. When the mono-ol compound is contained in an amount by mol of less than twice, gelation of the paste is difficult to prevent sufficiently. The mol amount of the released ions of multivalent metal can be measured by means of conventionally known techniques such as atomic absorption spectrophotometry, ICP, and ICP-MS, after the solid portion and the solution portion of the paste are separated from each other through centrifugation and filtration.

The first photosensitive conductive paste of the present invention further contains an organic solvent, and the paste preferably contains the mono-ol compound in an amount of about 10–92 wt. % based on the total amount of the mono-ol compound and the organic solvent. When the amount of the mono-ol compound is about 10 wt. % or less, gelation of the paste is impossible to suppress sufficiently, whereas when the amount is about 92 wt. % or more, the viscosity of the paste decreases considerably and coatability of the paste may be deteriorated.

In the second photosensitive conductive paste of the present invention, examples of the diol compounds having two alcoholic hydroxyl groups in each molecule include ethylene glycol, propylene glycol, trimethylene glycol, butylene glycol, tetramethylene glycol, pentamethylene glycol, butanediol, hexamethylene glycol, heptanediol, octanediol, nonanediol, decanediol, diethylene glycol, dipropylene glycol, triethylene glycol and tripropylene glycol.

Since the diol compounds described above have boiling points of about 178° C. or higher, the diol compound significantly remains in a dried composition, even after the paste is applied and dried, and exhibits sufficient ability to prevent gelation. As a result, consistent development can be carried out.

In the second photosensitive conductive paste of the present invention, the diol compound is preferably contained in an amount by mol of at least that of ions of the multivalent metal released in a solution portion of the paste. When the diol compound is contained in an amount by mol of less than the metal ions gelation of the paste is difficult to prevent sufficiently. As described above, the mol amount of the released ions of multivalent metal can be measured by means of conventionally known techniques such as atomic absorption spectrophotometry, ICP, and ICP-MS, after the solid portion and the solution portion of the paste are separated from each other through centrifugation and filtration.

The second photosensitive conductive paste of the present invention further contains an organic solvent, and the paste preferably contains the diol compound in an amount of about 10–92 wt. % based on the total amount of the diol compound and the organic solvent. When the amount of the diol compound is about 10 wt. % or less, gelation of the paste is impossible to suppress sufficiently, whereas when the amount is about 92 wt. % or more, the viscosity of the paste decreases considerably and coatability of the paste may deteriorate.

In the first and second photosensitive conductive pastes of the present invention, the aforementioned photosensitive organic component may be conventionally known photopolymerizable compounds or photomodifiable compounds. Examples of such compounds include (1) mixtures of a monomer or oligomer having a reactive functional group such as an unsaturated group and a photo-radical-initiator such as an aromatic carbonyl compound;

(2) diazo resins such as a condensate of an aromatic diazonium compound and formaldehyde;

(3) mixtures of an addition-polymerizable compound such as an epoxy compound and a photo-acid-generator such as a diaryliodonium salt; and (4) naphthoquinonediazide compounds.

Of these, mixtures of a monomer or oligomer having a reactive functional group such as an unsaturated group and a photo-radical-initiator such as an aromatic carbonyl compound are particularly preferred. Examples of monomers or oligomers having a reactive functional group include hexanediol triacrylate, tripropylene glycol triacrylate, trimethylolpropane triacrylate, stearyl acrylate, tetrahydrofurfuryl acrylate, lauryl acrylate, 2-phenoxyethyl acrylate, isodecyl acrylate, isooctyl acrylate, tridecyl acrylate, caprolactone acrylate, ethoxylated nonylphenol acrylate, 1,3-butanediol diacrylate, 1,4-butanediol diacrylate, diethylene glycol diacrylate, tetraethylene glycol diacrylate, triethylene glycol diacrylate, ethoxylated bisphenol A diacrylate, propoxylated neopentyl glycol diacrylate, tris(2-hydroxyethyl) isocyanurate triacrylate, ethoxylated trimethylolpropane triacrylate, pentaerythritol triacrylate, propoxylated trimethylolpropane triacrylate, propoxylated glyceryl triacrylate, pentaerythritol tetraacrylate, ditrimethylolpropane tetraacrylate, dipentaerythritol hydroxypentaacrylate, ethoxylated pentaerythritol tetraacrylate, tetrahydrofurfuryl methacrylate, cyclohexyl methacrylate, isodecyl methacrylate, lauryl methacrylate, triethylene glycol dimethacrylate, ethylene glycol dimethacrylate, tetraethylene glycol dimethacrylate, 1,4-butanediol dimethacrylate, diethylene glycol dimethacrylate, 1,6-hexanediol dimethacrylate, neopentyl glycol dimethacrylate, 1,3-butylene glycol dimethacrylate, ethoxylated bisphenol A dimethacrylate, and trimethylolpropane trimethacrylate.

Examples of the aforementioned photo-radical-generators include benzil, benzoin ethyl ether, benzoin isobutyl ether, benzoin isopropyl ether, benzophenone, benzoylbenzoic acid, methyl benzoylbenzoate, 4-benzoyl-4'-methyldiphenyl sulfide, benzyl dimethyl ketal, 2-n-butoxy-4-dimethylaminobenzoate, 2-chlorothioxanthone, 2,4-diethylthioxanthone, 2,4-diisopropylthioxanthone, isopropylthioxanthone, 2-dimethylaminoethyl benzoate, ethyl p-dimethylaminobenzoate, isoamyl p-dimethylaminobenzoate, 3,3'-dimethyl-4-methoxybenzophenone, 2,4-dimethylthioxanthone, 1-(4-dodecylphenyl)-2-hydroxy-2-methylpropan-1-one, 2,2-dimethoxy-1,2-diphenylethan-1-one, hydroxycyclohexyl phenyl ketone, 2-hydroxy-2-methyl-1-phenylpropan-1-one, 1-[4-(2-hydroxyethoxy)-phenyl]-2-hydroxy-2-methyl-1-propan-1-one, 2-methyl-1-[4-(methylthio)phenyl]-2-morpholinopropan-1-one, methylbenzoyl formate, 1-phenyl-1,2-propanedione-2-(o-ethoxycarbonyl) oxime, 2-benzyl-2-dimethylamino-1-(4-morpholinophenyl)-1-butanone, bis(2,6-dimethoxybenzoyl)-2,4,4-trimethylpentylphosphine oxide, and bis(2,4,6-trimethylbenzoyl)phenylphosphine oxide.

In the first and second photosensitive conductive pastes of the present invention, the organic binder having an acidic functional group such as a carboxyl group may be an acrylic copolymer having a carboxylic side chain. The material of the multivalent metal contained in the conductive metallic powder may be at least one species selected from the group consisting of copper, aluminum, palladium, nickel and iron.

Specifically, when the aforementioned organic binder is an acrylic copolymer having a carboxylic side chain and the aforementioned conductive metallic powder is a powder of a multivalent metal such as copper, aluminum, palladium, nickel or iron, a three-dimensional network structure formed through ionic cross-linking tends to be formed particularly easily. Therefore, when the aforementioned mono-ol compound having a boiling point of about 178° C. or higher or diol compound is incorporated into such a system, a remarkable effect may be obtained. The aforementioned conductive metallic powder may comprise conductive powder of metal such as gold, silver, platinum, molybdenum or tungsten in addition to the powder of the aforementioned multivalent metal.

The aforementioned acrylic copolymer may be produced through copolymerization of an unsaturated carboxylic acid and an ethylenic unsaturated compound. Examples of unsaturated carboxylic acids include acrylic acid, methacrylic acid, maleic acid, fumaric acid, vinyl acetate, and anhydrides thereof. Examples of ethylenic unsaturated compounds include acrylate esters such as methyl acrylate and ethyl acrylate; methacrylate esters such as methyl methacrylate and ethyl methacrylate; and fumarate esters such as monoethyl fumarate. Alternatively, the aforementioned acrylic copolymer to which an unsaturated bond in the following forms has been introduced may also be used:

(1) an acrylic copolymer obtained through addition of an acrylic monomer having a functional group; e.g., an epoxy group, reactive to a carboxyl group in a side chain of the aforementioned acrylic copolymer; and (2) an acrylic copolymer obtained through reaction of an unsaturated monocarboxylic acid with an acrylic copolymer having an epoxy group in a side chain instead of a carboxyl group and further introduction of a saturated or unsaturated multivalent carboxylic anhydride.

The first and second photosensitive conductive pastes of the present invention may contain, if necessary, optional additives including a storage stabilizer such as a polymerization inhibitor, an anti-oxidant; a dye; a pigment; a defoaming agent; and a surfactant. The aforementioned mono-ol compound may be used as a solvent component of the paste.

The photosensitive conductive paste of the present invention is applied to an insulating substrate by means of screen printing or spin coating, and the paste is dried and subjected to patterning by means of photolithography. Thus, a wiring pattern of 50 $\mu$m or less, which is difficult to form by means of conventional screen printing, can be formed. In this case, drying of the paste is performed under typical conditions for a photosensitive paste used in photolithography. Specifically, the paste is dried at 40–100° C. for 10 minutes to two hours.

In the present invention, there may be employed a photosensitive conductive paste containing a predetermined amount of a mono-ol compound having a boiling point of about 178° C. or higher and a predetermined amount of a diol compound having two alcoholic hydroxyl groups in the molecule.

As is described above, gelation of the first and second photosensitive conductive pastes of the present invention can be suppressed over time, and development of the paste can be carried out consistently by means of photolithography. Therefore, a fine thick-film conductive pattern can be formed, and a wiring pattern, electrode pattern, or a like pattern having excellent high-frequency properties can be formed. As a result, it is possible to attain a higher density or a higher signal speed of high-frequency chip electronic components such as a chip inductor and a chip-type monolithic capacitor and high-frequency modules such as a PLL module and a voltage-controlled oscillator, enabling production of high-frequency electronic components having small size and high performance. In addition to formation of a wiring or electrode pattern of high-frequency electronic components, the photosensitive conductive pastes of the present invention can be employed for a variety of applications such as formation of an address electrode of a plasma display panel.

EXAMPLES

The present invention will next be described in more detail by way of examples, which should not be construed as limiting the invention thereto.

(1) Embodiment 1

(Photosensitive Conductive Paste Containing a Mono-ol Compound)

Example 1

Materials, i.e., an organic binder, conductive metallic powder, a monomer containing a reactive group, a photopolymerization initiator, an organic solvent, and a mono-ol compound, having the following compositions were mixed in the following amounts, and the resultant mixture was kneaded by use of a three-roll mill, to thereby prepare a photosensitive conductive paste.

Organic Binder
  A copolymer of methacrylic acid and methyl methacrylate in which the weight ratio of methacrylic acid to methyl methacrylate is 25/75 (weight average molecular weight= 50,000): 2.0 g Conductive Material (Multivalent Metal)
  Copper powder: 9.0 g
Reactive-functional-group-containing Monomer
  Trimethylolpropane triacrylate: 1.0 g
Photopolymerization Initiator
  2-Methyl-1-[4-(methylthio)phenyl]-2-morpholinopropane-1-one: 0.4 g
  2,4-Diethylthioxanthone: 0.1 g
Organic Solvent
  Ethylcarbitol acetate: 4.0 g
Mono-ol Compound
  Dipropylene glycol monomethyl ether (boiling point: 189–190° C.): 1.0 g The thus-prepared photosensitive conductive paste was applied to an alumina insulating substrate by means of spin coating and dried at 100° C. for one hour, to thereby form a thick-film composition formed of the paste having a thickness of 10 $\mu$m. In this case, the amount by mol of copper ions released in a solution (solvent) portion of the paste was $0.12 \times 10^{-3}$ mol, while that of dipropylene glycol monomethyl ether was $6.8 \times 10^{-3}$ mol.

The thus-formed thick-film composition was allowed to stand for 24 hours, and subjected to exposure treatment. Rays from a high pressure mercury lamp were applied to the thick-film composition at an energy density of 250 mJ/cm$^2$ through a mask having the following pattern: line/space (L/S)=20/20 ($\mu$m). The resultant thick-film composition was developed by use of an aqueous solution of sodium carbonate, to thereby form a pattern of L/S=20/20 ($\mu$m). Thereafter, the composition was subjected to degreasing treatment and fired in an N$_2$ atmosphere at 900° C., to thereby form a conductive pattern having L/S=10/30 ($\mu$m).

The photosensitive conductive paste prepared in Example 1 was stored in air at 20° C. for evaluation of storage stability. As a result, it was found that the paste did not gel immediately after preparation, nor did the paste gel one day, three days, one week and one month after preparation. After each of the periods described above, the paste was able to be applied to an alumina insulating substrate by use of a spin coating apparatus, and a pattern could be formed by use of the paste through photolithography.

Example 2

The procedure of Example 1 was repeated, except that dipropylene glycol monomethyl ether was replaced by 2-octyl alcohol (boiling point: 178–179° C.) serving as a mono-ol compound, to thereby prepare a photosensitive conductive paste.

Example 3

The procedure of Example 1 was repeated, except that dipropylene glycol monomethyl ether was replaced by butyl lactate (boiling point: 185–187° C.) serving as a mono-ol compound, to thereby prepare a photosensitive conductive paste.

Example 4

The procedure of Example 1 was repeated, except that dipropylene glycol monomethyl ether was replaced by 3-methoxy-3-methylbutanol (boiling point: 173–175° C.) serving as a mono-ol compound, to thereby prepare a photosensitive conductive paste.

Example 5

The procedure of Example 1 was repeated, except that dipropylene glycol monomethyl ether was replaced by 4-methylcyclohexanol (boiling point: 172–175° C.) serving as a mono-ol compound, to thereby prepare a photosensitive conductive paste.

Example 6

The procedure of Example 1 was repeated, except that dipropylene glycol monomethyl ether was replaced by 1-heptyl alcohol (boiling point: 176° C.) serving as a mono-ol compound, to thereby prepare a photosensitive conductive paste.

In the same manner as in Example 1, films having a thickness of 10 μm were formed on alumina insulating substrates by use of the respective photosensitive conductive paste prepared in Examples 2 to 6. After 24 hours, the respective films were exposed to rays of a high pressure mercury lamp through a mask having a pattern of L/S=20/20 (μm), and developed by use of an aqueous solution of sodium carbonate.

The thick-film compositions—formed of the respective photosensitive conductive pastes of Examples 1 to 6—were evaluated for stability during development. The results are shown in Table 1. In Table 1, rating "O" refers to the case where unexposed portions of the paste dissolved into a developer, and a pattern was formed successfully. In Table 1, rating "Δ" refers to the case where unexposed portions of the paste partially dissolved into a developer, and a pattern was formed insufficiently. In Table 1, rating "X" refers to the case where unexposed portions of the paste failed to dissolve into a developer, and a pattern failed to be formed.

TABLE 1

| | Mono-ol compound | Boiling point | Rating |
|---|---|---|---|
| Example 1 | Dipropylene glycol monomethyl ether | 189–190° C. | O |
| Example 2 | 2-Octyl alcohol | 178–179° C. | O |
| Example 3 | Butyl Lactate | 185–187° C. | O |
| Example 4 | 3-Methoxy-3-methyl-butanol | 173–175° C. | X |
| Example 5 | 4-Methylcyclohexanol | 172–175° C. | X |
| Example 6 | 1-Heptyl alcohol | 176° C. | Δ |

As is apparent from Table 1, in the cases of the photosensitive conductive pastes of Examples 1 to 3, which contain mono-ol compounds having a boiling point of about 178° C. or higher, unexposed portions of the paste dissolve into a developer with ease, and a well-shaped conductive pattern can be formed.

In contrast, as is apparent from Table 1, as in the cases of Examples 4 to 6, when the photosensitive conductive paste contains a mono-ol compound having a boiling point of about 178° C. or higher, the mono-ol compound evaporates during drying treatment after application of the paste, and thus gelation-preventing ability decreases with passage of time.

Subsequently, the photosensitive conductive paste was evaluated for storage stability while the paste was in its original state in the following cases: the case where the paste contains no mono-ol compound; and the case where the paste contains a gelation-preventing agent other than a mono-ol compound.

Example 7

The procedure of Example 1 was repeated, except that dipropylene glycol monomethyl ether was not incorporated, to thereby prepare a photosensitive conductive paste.

Example 8

The procedure of Example 1 was repeated, except that dipropylene glycol monomethyl ether (1.0 g) was replaced by phosphoric acid (0.1 g), to thereby prepare a photosensitive conductive paste.

Example 9

The procedure of Example 1 was repeated, except that dipropylene glycol monomethyl ether (1.0 g) was replaced by benzotriazole (0.02 g), to thereby prepare a photosensitive conductive paste.

Example 10

The procedure of Example 1 was repeated, except that dipropylene glycol monomethyl ether (1.0 g) was replaced by acetic acid (1.0 g), to thereby prepare a photosensitive conductive paste.

The respective photosensitive conductive pastes of Examples 7 to 10 were evaluated for storage stability. The pastes were stored in air at 20° C. The results are shown in Table 2 together with the evaluation results of the paste of Example 1. In Table 2, rating "O" refers to the case where gelation of the paste did not occur and application of the paste was possible. In contrast, rating "X" refers to the case where the paste gelled and application of the paste was impossible.

TABLE 2

| | Additive | Immediately after preparation | After one day | After three days | After one week | After one month |
|---|---|---|---|---|---|---|
| Example 1 | Dipropylene glycol monomethyl ether | O | O | O | O | O |
| Example 7 | None | O | X | X | X | X |
| Example 8 | Phosphoric acid | O | X | X | X | X |
| Example 9 | Benzotriazole | O | X | X | X | X |
| Example 10 | Acetic acid | O | X | X | X | X |

As is apparent from Table 2, gelation-preventing agents other than dipropylene glycol monomethyl ether, which is a mono-ol compound having a boiling point of about 178° C. or higher, can prevent gelation of the pastes immediately after preparation, and thus the pastes exhibit good stability. However, the pastes containing such agents gel with passage of time.

Examples 11 to 18

The procedure of Example 11 was repeated, except that the amounts of ethylcarbitol acetate and dipropylene glycol monomethyl ether were modified as shown in Table 3, to thereby prepare photosensitive conductive pastes having compositions shown in Examples 11 to 18 in Table 3. The respective photosensitive conductive pastes were evaluated for storage stability. The pastes were stored in air at 20° C.

Furthermore, the respective photosensitive conductive pastes prepared in Examples 11 to 18 were evaluated for coatability. Each paste was applied onto an aluminum insulating substrate by means of spin coating. The coatability was judged by difference between the target film thickness (15 μm) and an actual film thickness.

The results of the assessment in terms of storage stability and coatability of the photosensitive conductive pastes prepared in Examples 11 to 18 are shown in Table 3. In Table 3, rating for storage stability "O" refers to the case where gelation of the paste did not occur and application of the paste was possible. In contrast, rating "X" refers to the case where the paste gelled and application of the paste was impossible. The rating for coatability "O" refers to the case where the difference between the target film thickness and the actual film thickness was 0.5 μm or less, i.e., good coatability. In contrast, rating "X" refers to the case where the difference between the target film thickness and the actual film thickness was in excess of 0.5 μm, i.e., poor coatability. In Table 3, the wt. % of a mono-ol compound refers to a ratio of the weight of dipropylene glycol monomethyl ether to the total weight of ethylcarbitol acetate serving as a solvent and dipropylene glycol monomethyl ether serving as a mono-ol compound.

Photopolymerization Initiator
   2-Methyl-1-[4-(methylthio)phenyl]-2-morpholinopropane-1-one: 0.4 g
   2,4-Diethylthioxanthone: 0.1 g
Diol Compound
   Pentamethylene glycol (boiling point: 242° C.): 1.0 g
Organic Solvent
   Ethylcarbitol acetate: 4.0 g The thus-prepared photosensitive conductive paste was applied to an alumina insulating substrate by means of spin coating and dried at 100° C. for one hour, to thereby form a thick-film composition formed of the paste having a thickness of 10 μm. In this case, the amount by mol of copper ions released in a solution (solvent) portion of the paste was $0.12 \times 10^{-3}$ mol, while that of pentamethylene glycol was $9.6 \times 10^{-3}$ mol.

The thus-formed thick-film composition was allowed to stand for 24 hours, and subjected to exposure treatment.

TABLE 3

| | Mono-ol compound | | Organic solvent | Storage stability | | | | | | Paste coatability |
| | Amount (g) | Wt. % | (g) | Immediately after preparation | After one day | After three days | After one week | After two weeks | After one month | |
|---|---|---|---|---|---|---|---|---|---|---|
| Example 11 | 0.4 | 8 | 4.6 | O | O | O | O | O | X | O |
| Example 12 | 0.45 | 9 | 4.65 | O | O | O | O | O | X | O |
| Example 13 | 0.5 | 10 | 4.5 | O | O | O | O | O | O | O |
| Example 14 | 0.6 | 12 | 4.4 | O | O | O | O | O | O | O |
| Example 15 | 4.5 | 90 | 0.5 | O | O | O | O | O | O | O |
| Example 16 | 4.55 | 91 | 0.45 | O | O | O | O | O | O | O |
| Example 17 | 4.6 | 92 | 0.4 | O | O | O | O | O | O | O |
| Example 18 | 4.65 | 93 | 0.35 | O | O | O | O | O | O | X |

As is clear from Table 3, photosensitive conductive pastes prepared in Examples 13 to 17, the pastes containing about 10–92 wt. % of a mono-ol compound, effectively prevented gelation until one month after preparation. Thus, these pastes had remarkably excellent storage stability. In addition, these pastes also had excellent coatability.

In contrast, the photosensitive pastes prepared in Examples 11 and 12 containing less than 10 wt. % of a mono-ol compound, exhibiting a certain degree of storage stability, starts to gel as time passes. The paste prepared in Example 18, the paste containing a diol compound in excess of 92 wt. % exhibits poor coatability.

Embodiment 2
(Photosensitive Conductive Paste Containing a Diol Compound)

Example 19

Materials, i.e., an organic binder, conductive metallic powder, a monomer containing a reactive group, a photopolymerization initiator, an organic solvent, and a diol compound, having the following compositions were mixed in the following amounts, and the resultant mixture was kneaded by use of a three-roll mill, to thereby prepare a photosensitive conductive paste.
Organic Binder
   A copolymer of methacrylic acid and methyl methacrylate in which the weight ratio of methacrylic acid to methyl methacrylate is 25/75 (weight average molecular weight= 50,000): 2.0 g
Conductive Material (Multivalent Metal)
   Copper powder: 9.0 g
Reactive-functional-group-containing Monomer
   Trimethylolpropane triacrylate: 1.0 g Rays from a high pressure mercury lamp were applied to the thick-film composition at an energy density of 250 mJ/cm² through a mask having the following pattern: line/space (L/S)=20/20 (μm). The resultant thick-film composition was developed by use of an aqueous solution of sodium carbonate, to thereby form a pattern of L/S=20/20 (μm). Thereafter, the composition was subjected to degreasing treatment and fired in an $N_2$ atmosphere at 900° C., to thereby form a conductive pattern having L/S=10/30 (μm).

The photosensitive conductive paste prepared in Example 1 was stored in air at 20° C. for evaluation of storage stability. As a result, it was found that the paste did not gel immediately after preparation, nor did the paste gel one day, three days, one week and one month after preparation. After each of the periods described above, the paste was able to be applied to an alumina insulating substrate by use of a spin coating apparatus, and a pattern could be formed by use of the paste through photolithography.

The storage stability of photosensitive conductive pastes containing no diol compound or containing a gelation-preventing agent other than a diol compound were evaluated, while the pastes were in an undried state.

Example 20

The procedure of Example 19 was repeated, except that pentamethylene glycol was not added, to thereby prepare a photosensitive conductive paste.

Example 21

The procedure of Example 19 was repeated, except that pentamethylene glycol (1.0 g) was replaced by phosphoric acid (0.1 g), to thereby prepare a photosensitive conductive paste.

Example 22

The procedure of Example 19 was repeated, except that pentamethylene glycol (1.0 g) was replaced by benzotriazole (0.02 g), to thereby prepare a photosensitive conductive paste.

Example 23

The procedure of Example 19 was repeated, except that pentamethylene glycol (1.0 g) was replaced by acetic acid (1.0 g), to thereby prepare a photosensitive conductive paste.

The respective photosensitive conductive pastes of Examples 19 to 23 were evaluated for storage stability. The pastes were stored in air at 20° C. The results are shown in Table 4 together with the evaluation results of the paste of Example 19. In Table 4, rating "O" refers to the case where gelation of the paste did not occur and application of the paste was possible. In contrast, rating "X" refers to the case where the paste gelled and application of the paste was impossible.

lating substrate by means of spin coating. The coatability was judged by difference between the target film thickness (15 μm) and an actual film thickness.

The results of the assessment in terms of storage stability and coatability of the photosensitive conductive pastes prepared in Examples 24 to 31 are shown in Table 5. In Table 5, rating for storage stability "O" refers to the case where gelation of the paste did not occur and application of the paste was possible. In contrast, rating "X" refers to the case where the paste gelled and application of the paste was impossible. The rating for coatability "O" refers to the case where the difference between the target film thickness and the actual film thickness was 0.5 μm or less, i.e., good coatability. In contrast, rating "X" refers to the case where the difference between the target film thickness and the actual film thickness was in excess of 0.5 μm, i.e., poor coatability. In Table 5, the wt. % of a diol compound refers to a ratio of the weight of pentamethylene glycol to the total weight of ethylcarbitol acetate serving as a solvent and pentamethylene glycol serving as a diol compound.

TABLE 4

| | Additive | Immediately after preparation | After one day | After three days | After one week | After one month |
|---|---|---|---|---|---|---|
| Example 19 | Pentamethylene glycol | O | O | O | O | O |
| Example 20 | None | O | X | X | X | X |
| Example 21 | Phosphoric acid | O | X | X | X | X |
| Example 22 | Benzotriazole | O | X | X | X | X |
| Example 23 | Acetic acid | O | X | X | X | X |

As is apparent from Table 4, gelation-preventing agents other than pentamethylene glycol, which is a diol compound, can prevent gelation of the pastes immediately after preparation, and thus the pastes exhibit good stability. However, the pastes containing such agents gel with passage of time.

Examples 24 to 31

The procedure of Example 11 was repeated, except that the amounts of ethylcarbitol acetate and pentamethylene glycol were modified as shown in Table 5, to thereby prepare photosensitive conductive pastes having compositions shown in Examples 24 to 31 in Table 5. The respective photosensitive conductive pastes were evaluated for storage stability. The pastes were stored in air at 20° C.

Furthermore, the respective photosensitive conductive pastes prepared in Examples 24 to 31 were evaluated for coatability. Each paste was applied onto an aluminum insu-

TABLE 5

| | Diol compound | | Organic solvent (g) | Storage stability | | | | | | Paste coatability |
|---|---|---|---|---|---|---|---|---|---|---|
| | Amount (g) | Wt. % | | Immediately after preparation | After one day | After three days | After one week | After two weeks | After one month | |
| Example 24 | 0.4 | 8 | 4.6 | O | O | O | O | O | X | O |
| Example 25 | 0.45 | 9 | 4.65 | O | O | O | O | O | X | O |
| Example 26 | 0.5 | 10 | 4.5 | O | O | O | O | O | O | O |
| Example 27 | 0.6 | 12 | 4.4 | O | O | O | O | O | O | O |
| Example 28 | 4.5 | 90 | 0.5 | O | O | O | O | O | O | O |
| Example 29 | 4.55 | 91 | 0.45 | O | O | O | O | O | O | O |
| Example 30 | 4.6 | 92 | 0.4 | O | O | O | O | O | O | O |
| Example 31 | 4.65 | 93 | 0.35 | O | O | O | O | O | O | X |

As is clear from Table 5, photosensitive conductive pastes prepared in Examples 26 to 30, the pastes containing 10–92 wt. % of a diol compound, effectively prevented gelation until one month after preparation. Thus, these pastes had remarkably excellent storage stability. In addition, these pastes also had excellent coatability.

In contrast, the photosensitive pastes prepared in Examples 24 and 25 containing less than 10 wt. % of a diol compound, exhibiting a certain degree of storage stability, starts to gel as time passes. The paste prepared in Example 31, the paste containing a diol compound in excess of 92 wt. % exhibits poor coatability.

While the invention has been particularly shown and described with reference to preferred embodiments thereof, it will be understood by those skilled in the art that the forgoing and other changes in form and details may be made therein without departing from the spirit of the invention.

What is claimed is:

1. A photosensitive conductive paste, comprising a mixture of:
   an organic binder having an acidic functional group;
   a photosensitive organic component;
   a conductive metallic powder containing a multivalent metal;
   an alcohol selected from the group consisting of a mono-ol compound having a boiling point of about 178° C. or higher, a diol and a mixture thereof; and
   and organic solvent;
   wherein the alcohol is present in an amount by mol of at least twice that of ions of the multivalent metal released in a solution portion of the paste and the amount of the alcohol is about 10–92 wt. % based on the total amount of the alcohol and the organic solvent.

2. The photosensitive conductive paste according to claim 1, wherein the alcohol is said mono-ol.

3. The photosensitive conductive paste according to claim 2, wherein the conductive multivalent metal powder is of at least one member selected from the group consisting of copper, aluminum, palladium, nickel and iron.

4. The photosensitive conductive paste according to claim 3, wherein the organic binder having an acidic functional group is an acrylic copolymer having a carboxylic side chain.

5. The photosensitive conductive paste according to claim 4, wherein the mono-ol is dipropylene glycol monomethyl ether, octyl alcohol or butyl lactate.

6. The photosensitive conductive paste according to claim 2, wherein the mono-ol is dipropylene glycol monomethyl ether, octyl alcohol or butyl lactate.

7. The photosensitive conductive paste according to claim 1, wherein the alcohol is a diol.

8. The photosensitive conductive paste according to claim 7, wherein the conductive multivalent metal powder is at least one member selected from the group consisting of copper, aluminum, palladium, nickel and iron.

9. The photosensitive conductive paste according to claim 8, wherein the organic binder having an acidic functional group is an acrylic copolymer having a carboxylic side chain.

10. The photosensitive conductive paste according to claim 9, wherein the diol is pentamethylene glycol.

11. The photosensitive conductive paste according to claim 7, wherein the organic binder having an acidic functional group is an acrylic copolymer having a carboxylic side chain.

12. The photosensitive conductive paste according to claim 7, wherein the diol is pentamethylene glycol.

13. The photosensitive conductive paste according to claim 1 containing both said mono-ol and said diol.

* * * * *